US008464637B2

(12) United States Patent
Hackler et al.

(10) Patent No.: US 8,464,637 B2
(45) Date of Patent: Jun. 18, 2013

(54) METHOD AND APPARATUS FOR THERMAL DEVELOPMENT HAVING A TEXTURED SUPPORT SURFACE

(75) Inventors: Mark A. Hackler, Ocean, NJ (US); David Anthony Belfiore, Landenberg, PA (US); Dietmar Dudek, Langen (DE); Anandkumar R. Kannurpatti, Glen Mills, PA (US); Andreas Koch, Wiesbaden (DE)

(73) Assignee: E I du Pont de Nemours and Company, Wilmington, DE (US)

( * ) Notice: Subject to any disclaimer, the term of this patent is extended or adjusted under 35 U.S.C. 154(b) by 109 days.

(21) Appl. No.: 12/786,051

(22) Filed: May 24, 2010

(65) Prior Publication Data
US 2010/0242761 A1 Sep. 30, 2010

Related U.S. Application Data

(62) Division of application No. 11/286,957, filed on Nov. 23, 2005, now abandoned.

(60) Provisional application No. 60/632,367, filed on Dec. 2, 2004.

(51) Int. Cl.
*G03F 7/34* (2006.01)
(52) U.S. Cl.
USPC ......... 101/401.1; 101/375; 101/395; 430/306
(58) Field of Classification Search
None
See application file for complete search history.

(56) References Cited

U.S. PATENT DOCUMENTS

| | | | |
|---|---|---|---|
| 2,452,821 A * | 11/1948 | Wood, Jr. | 264/107 |
| 3,060,023 A | 10/1962 | Metuchen et al. | |
| 5,279,697 A | 1/1994 | Peterson et al. | |
| 6,797,454 B1 | 9/2004 | Johnson et al. | |
| 2003/0101885 A1 | 6/2003 | Jordan et al. | |
| 2005/0142494 A1 | 6/2005 | Hackler et al. | |
| 2005/0211119 A1 | 9/2005 | Markhart | |
| 2005/0211120 A1 | 9/2005 | Markhart | |
| 2005/0211121 A1 | 9/2005 | Vest et al. | |
| 2005/0241509 A1 | 11/2005 | Gotsick et al. | |

OTHER PUBLICATIONS

3M Worldwide, 3M Flexographic Printing: E1020 Cushion Mount Plus, E1020 Cushion Mount Plus Combination Printing Tape, Product Flyer & Data Page (6 Pages).
3M Worlwide, 2205 Thin Flexographic Mounting Tape, Product Flyer & Data Page, (6 Pages).
3M Worldwide, 3M Flexographic Printing: E1020 Cushion Mount Plus, E1020 Cushion Mount Plus Combination Printing Tape, Product Flyer & Data Page (6 Pages), 2006.
3M Worlwide, 2205 Thin Flexographic Mounting Tape, Product Flyer & Data Page, (6 Pages), 2006.

* cited by examiner

*Primary Examiner* — Joshua D Zimmerman

(57) ABSTRACT

The invention is a method and apparatus for forming a relief structure by thermally developing a photosensitive element containing a composition layer capable of being partially liquefied. During thermal development, the photosensitive element is supported on a base member having an exterior surface that is textured. The textures for the exterior surface include a particular surface roughness and/or patterns.

45 Claims, 5 Drawing Sheets

METHOD AND APPARATUS FOR THERMAL DEVELOPMENT HAVING A TEXTURED SUPPORT SURFACE

BACKGROUND OF THE INVENTION

1. Field of the Invention

This invention pertains to a method and apparatus for forming a relief structure from a photosensitive element, and particularly to a method and apparatus for thermally developing a photosensitive element containing a composition layer capable of being partially liquefied.

2. Description of Related Art

Flexographic printing plates are well known for use in printing surfaces which range from soft and easy to deform to relatively hard, such as packaging materials, e.g., cardboard, plastic films, aluminum foils, etc. Flexographic printing plates can be prepared from photosensitive elements containing photopolymerizable compositions, such as those described in U.S. Pat. Nos. 4,323,637 and 4,427,759. The photopolymerizable compositions generally comprise an elastomeric binder, at least one monomer and a photoinitiator. Photosensitive elements generally have a layer of the photopolymerizable composition interposed between a support and a coversheet or multilayer cover element. Upon imagewise exposure to actinic radiation, photopolymerization of the photopolymerizable layer occurs in the exposed areas, thereby curing and rendering insoluble the exposed areas of the layer. Conventionally, the element is treated with a suitable solution, e.g., solvent or aqueous-based washout, to remove the unexposed areas of the photopolymerizable layer leaving a printing relief which can be used for flexographic printing. However, developing systems that treat the element with a solution are time consuming since drying for an extended period (0.5 to 24 hours) is necessary to remove absorbed developer solution.

As an alternative to solution development, a "dry" thermal development process may be used which removes the unexposed areas without the subsequent time-consuming drying step. In a thermal development process, the photosensitive layer, which has been imagewise exposed to actinic radiation, is contacted with an absorbent material at a temperature sufficient to cause the composition in the unexposed portions of the photosensitive layer to soften or melt and flow into the absorbent material. See U.S. Pat. No. 3,060,023 (Burg et al.); U.S. Pat. No. 3,264,103 (Cohen et al.); U.S. Pat. No. 5,015,556 (Martens); U.S. Pat. No. 5,175,072 (Martens); U.S. Pat. No. 5,215,859 (Martens); and U.S. Pat. No. 5,279,697 (Peterson et al.). The exposed portions of the photosensitive layer remain hard, that is do not soften or melt, at the softening temperature for the unexposed portions. The absorbent material collects the softened un-irradiated material and then is removed from the photosensitive layer. The cycle of heating and contacting the photosensitive layer may need to be repeated several times in order to sufficiently remove the flowable composition from the un-irradiated areas and form a relief structure suitable for printing. After such processing, there remains a raised relief structure of irradiated, hardened composition that represents the irradiated image.

Processors for thermal development of flexographic printing elements are known. U.S. Pat. No. 5,279,697 describes an automated process and apparatus for handling an irradiated printing element and accomplishing repeated heating and pressing to remove the unirradiated composition from the element. The apparatus includes a preheating drum that is coated with a silicone rubber composition layer having a Shore A hardness rating between about 30 and 60. The rubber coating may be impregnated with aluminum particles. U.S. Pat. No. 6,797,454 B1 also describes a method and apparatus for thermally processing a photosensitive element. The apparatus includes a drum coated with a rubber composition and/or a thin tackification coating layer on a smooth metallic surface of the drum. The rubber coating provides a resilient surface that can deflect under the pressure exerted by a developing hot roller. The tackification layer temporarily adheres the photosensitive layer to the drum as the drum rotates during processing, and if no rubber layer is present, can improve the thermal conductivity between the drum and the photosensitive element.

In an embodiment of a thermal processor, commercially identified as CYREL® FAST 1000TD processor, an exterior surface of the drum includes a silicone rubber layer having a Shore A hardness of 50, and a tackification layer on the rubber layer. The tackification layer is DOW 236, a silicone dispersion in solvent, available from Dow Corning. The outermost surface of the drum may have some minimal level of roughness which forms as the coating of the tackification layer dries. But oftentimes the surface roughness is not consistently present, and even when present, the surface is insufficient to provide the desired conditions for the photosensitive element during thermal processing.

A problem arises in these thermal development processors in that the drum must have sufficient tack to hold the photosensitive element to the drum as the drum rotates, but yet allow for air trapped underneath the element to escape. In commercial embodiments of the photosensitive element, the support typically is a polymeric film, such as a polyethylene terephthalate film, having a relatively smooth surface. The support of the element resides on the drum surface. When the support contacts the tacky surface of the drum during mounting of the element, pockets of entrapped air can be formed between the relatively smooth surfaces of the element and the drum. Air trapped between the element and the drum can cause overheating of the element during thermal processing, particularly the support, which can induce defects in the resulting relief element. Areas of the support that are in contact with the drum surface are able to dissipate the heat from the element to the drum, whereas areas of the support that have an underlying pocket of air, i.e., do not contact the drum surface, and overheat. If during thermal processing, the support is at a temperature higher than the glass transition temperature due to the overheated support areas, the dimensional stability of the support can be compromised and can uncontrollably distort.

Conventional photosensitive elements having a support with a matte layer or surface that is adjacent the drum surface may be used to aid in the removal of trapped air. Generally however the matte support is not sufficiently rough enough to overcome the entrapment of air during mounting to the drum, particularly for drums with resilient outer layer. Even if the roughness of the matte surface of the support was increased to reduce air entrapment, for example, by increasing the size or density of matte particles in the matte layer, end-use procedures for the photosensitive element, such as exposure through the support forming the floor and adhesion of the plate on press, could be significantly affected.

Yet the drum surface should have sufficient tack to hold the photosensitive element to the drum during thermal development. Insufficient tackiness of the tacky layer will not retain the photosensitive element in place as the drum rotates the element through the developing cycle of heating the element and contacting with the absorbent material. If the photosensitive element is not appreciably held in contact with the drum, the element can rub against other parts of the processor and damage the relatively soft printing surface. Depending on the orientation of heating elements, the photosensitive element can possibly contact hot surfaces of the heating elements, resulting in damage to the photosensitive element, or the heating elements, or both.

During thermal treatment, the photosensitive element can lift off or sag from the drum surface due to insufficient tack on the drum surface or from the trapped air pockets that can result in uncontrolled separation between the element and the drum. Uncontrolled lifting or sagging of the photosensitive element while the element is still hot, weakens the element due to local heating and loss of support from the drum and can induce strains in the structure of the element which creates a defect, called waves, in the resulting printing relief element. The non-uniform strains imparted in the element while the support is at a temperature higher than the glass transition temperature result in deformations that remain after the element has cooled or returned to room temperature. The deformations are waves of localized distortions resulting in a non-planar topography of the photosensitive element. Because of entrapped air pockets and the uncontrolled nature of the web separation in thermal development of the prior art, waves of distortions can form in different locations in each element processed. Additionally, areas of the photosensitive element that have lifted or sagged from the drum can be further distorted when they pass through the nip resulting in permanent creases in the support layer.

Relief printing forms having waves and/or creases result in poor print performance. In multicolor printing, when one or more of the relief printing forms have waves the printed image has poor registration. Even in single color printing, waves in the relief printing form may print an image that is not an accurate reproduction of its original, so called image infidelity, by printing straight lines as curves for example. Further, the relief printing form having waves may incompletely print the image due to intermittent contact of the inked surface of the printing form to the printed substrate.

SUMMARY OF THE INVENTION

The present invention provides a method for forming a relief structure from a photosensitive element having an exterior surface and an interior surface and containing a composition layer capable of being partially liquefied. The method comprises supplying a development medium to the exterior surface with a first member, and supporting the photosensitive element on a base member having an exterior surface, wherein the interior surface of the element is adjacent the exterior surface of the base member. The exterior surface of the base member has a texture selected from the group consisting of a surface having a roughness, Rq, of at least 1 micron when measured over a 250 to 1000 micron length scale; a surface having a roughness, Rq, of at least 3 micron when measured over a 500 to 3000 micron length scale. a surface having a pattern of grooves, channels, peaks, connected cells, or a combination of grooves, channels, peaks, connected cells; and a surface having a combination of the roughness and the pattern of grooves, channels, peaks, and connected cells.

In accordance with another aspect of this invention there is provided an apparatus for forming a relief structure from a photosensitive element having an exterior surface and an interior surface and containing a composition layer capable of being partially liquefied. The apparatus comprising means for supplying a development medium to the exterior surface with a first member; and means for supporting the photosensitive element on a base member having an exterior surface, wherein the interior surface of the element is adjacent the exterior surface of the base member. The exterior surface of the base member has a texture selected from the group consisting of a surface having a roughness, Rq, of at least 1 micron when measured over a 250 to 1000 micron length scale; a surface having a roughness, Rq, of at least 3 micron when measured over a 500 to 3000 micron length scale; a surface having a pattern of grooves, channels, peaks, connected cells, or a combination of grooves, channels, peaks, connected cells; and a surface having a combination of the roughness and the pattern of grooves, channels, peaks, and connected cells.

BRIEF DESCRIPTION OF THE DRAWINGS

FIGS. 3a and 3b show the exterior surfaces of supports that have not been textured. FIGS. 3c and 3d show the exterior surfaces of supports that have been textured according to the present invention.

FIG. 4a is a histogram plot for an exterior surface that has not been textured. FIGS. 4b and 4c are each a histogram plot of the exterior surfaces of supporting base members that have been textured according to the present invention.

DESCRIPTION OF THE PREFERRED EMBODIMENT(S)

Figure 1:
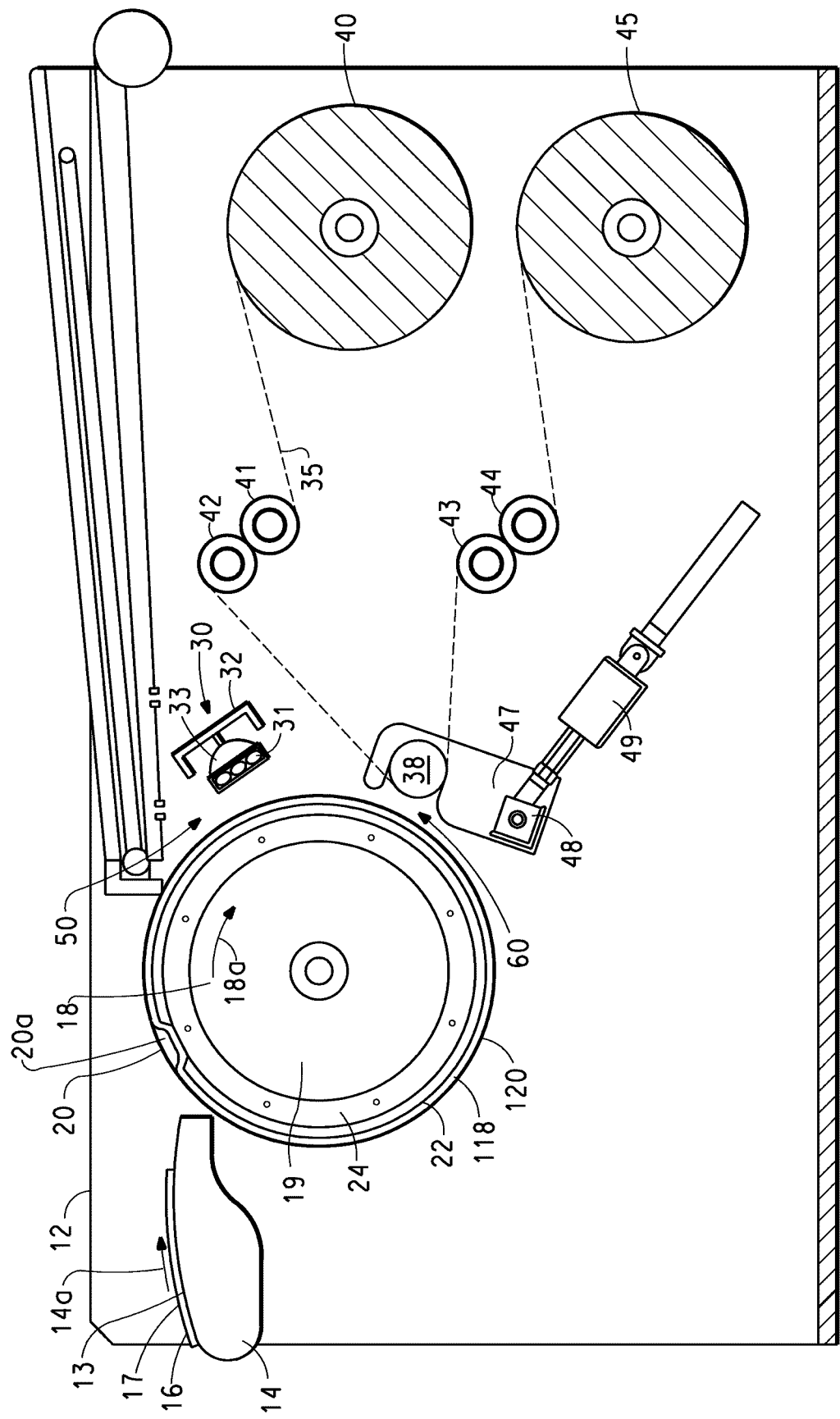
FIG. 1 is a schematic cross-sectional side view of a thermal development apparatus depicting one embodiment wherein a supporting surface for a photosensitive element is provided by a flexible support member that is removably mounted on a base member shaped as a drum.

Throughout the following detailed description, similar reference characters refer to similar elements in all figures of the drawings.

The present invention is a method and apparatus for forming a relief structure from a photosensitive element. In particular the present invention is a method and apparatus for thermally developing a photosensitive element, preferably to form a flexographic printing form. The present invention contemplates a method and apparatus capable of heating a photosensitive element having a layer of composition capable of being partially liquefied to a temperature sufficient to melt or soften or liquefy at least a portion of the layer for any purpose.

Thermal development heats the photosensitive element to a development temperature that causes uncured portions of the composition layer to liquefy, i.e., melt or soften or flow, and be carried away by contact with an absorbent material. Cured portions of the photosensitive layer have a higher melting or softening or liquefying temperature than the uncured portions and therefore do not melt, soften, or flow at the thermal development temperatures. Thermal development of photosensitive elements to form flexographic printing plates is described in U.S. Pat. Nos. 5,015,556; 5,175,072; 5,215,859; and WO 98/13730. The photosensitive element includes a substrate and at least a composition layer mounted on the substrate. The composition layer is capable of being partially liquefied.

The term "melt" is used to describe the behavior of the unirradiated portions of the composition layer subjected to an elevated temperature that softens and reduces the viscosity to permit absorption by the absorbent material. The material of the meltable portion of the composition layer is usually a viscoelastic material which does not have a sharp transition between a solid and a liquid, so the process functions to absorb the heated composition layer at any temperature above some threshold for absorption in the absorbent material. Thus, the unirradiated portions of the composition layer soften or liquefy when subjected to an elevated temperature. However throughout this specification the terms "melting", "softening", and "liquefying" may be used to describe the behavior of the heated unirradiated portions of the composition layer, regardless of whether the composition may or may not have a sharp transition temperature between a solid and a liquid state. A wide temperature range may be utilized to "melt" the composition layer for the purposes of this invention. Absorption may be slower at lower temperatures and faster at higher temperatures during successful operation of the process.

Apparatuses suitable for thermally developing the photosensitive element are disclosed by Peterson in U.S. Pat. No. 5,279,697, and by Johnson et al. in U.S. Pat. No. 6,797,454 B1. U.S. Pat. No. 5,279,697 shows two embodiments in which the photosensitive element is placed on a planar surface for thermal treatment. Both patents show a drum supporting the photosensitive element for thermal treatment. The photosensitive element in all embodiments is in the form of a plate. Another apparatus suitable for thermally developing a cylindrically-shaped photosensitive element is described in to U.S. provisional patent application Ser. No. 60/627,222 filed Nov. 12, 2004. Further suitable thermal developing apparatuses are disclosed in U.S. Publication Nos. US 2005/0211119, US 2005/0211120, US 2005/0211121, and US 2005/0241509. It should be understood that one of ordinary skill in the art could modify each of the above apparatuses to accommodate a base member having a textured exterior surface.

The present invention includes the step of supporting the photosensitive element on a base member having an exterior surface that has a texture. The texture of the exterior surface reduces the tendency of inducing defects into photosensitive elements during thermal processing. Photosensitive elements thermally processed according to the present invention have no or reduced deformations and/or distortions, e.g., waves. Waves may also be referred to as chevrons. The textured surface of the base member reduces or eliminates entrapping air between the element and the base member. The air escapes and/or redistributes more easily under the element so that the element is more uniformly heated and does not overheat causing uncontrollable distortion in the element. The textured surface can also compensate for the possible thermal expansion of the element by allowing for some movement or slippage of the element during thermal treatment. In one embodiment, the texture of the exterior surface may also reduce the effective tack of the element to the base member, which allows the plate to slide but not sag, while still being tacky enough to retain the element on the base member. In another embodiment, the exterior surface has a texture that sufficiently eliminates air entrapment between the element and the base member, and has tackiness to the extent that the plate does not slide or slip during thermal development.

The texture of the exterior surface of the base member is selected from the group consisting of a surface having a roughness, Rq, of at least 1 micron measured over a 250 to 1000 micron scale; a surface having a pattern of grooves, channels, peaks, connected cells, or a combination of grooves, channels, peaks, and connected cells; and, a surface having a combination of the roughness, Rq, and the pattern of grooves, channels, peaks, and connected cells.

Although there are a plurality of methods to describe the roughness of a surface, the most common measurements generate a two dimensional representation of the surface expressed as a profile height (y) as a function of scan direction (x). From this information one or more of a number of surface profile parameters can be calculated. Specific parameters, such as Ra, Rq, and Rz(DIN), are often used as descriptors and are calculations based on an analysis of the surface profile. Ra represents the average deviation of the surface profile from the surface profile mean. Rq is a statistical analysis which represents the average of the square of the deviations of the profile from the mean line (i.e., the standard deviation of the profile deviations). Rz(DIN) breaks a profile scan into five equal lengths, determines the maximum peak to valley distance within each of the five subsets of the scan length and averages the five maximum peak to valley excursions of the profile. In the present invention the surface roughness is expressed as Rq.

Surface roughness is the closely spaced unevenness of a solid surface composed of pits and projections. Surface roughness of the exterior surface of the support member may be measured by analysis of data obtained through optical interferometry, specifically applying surface roughness measurements Rq as defined by ISO 4287 or DIN 4762. In the present invention, the surface roughness, Rq, is a statistical analysis that represents an average of the square of the deviations in the surface profile, i.e., projections and pits, from the mean surface or plane (i.e., the standard deviation of the profile deviations). Surface roughness may also be referred to as Rq or as a root mean square (RMS) roughness. The length scale is the field of measurement used by the instrument for a roughness calculation, generally expressed as a unit of length, e.g., micron (micrometer). The length scale is important because features larger than the length scale of the measurement are not fully traversed and thus may not be completely captured in the resulting roughness measurement. Similarly, increasing the length scale can make the measurement more sensitive to curvature of the sample that is not related to the surface texture of interest. The surface roughness of the exterior surface defined by the property Rq as determined by these methods is at least 1 micron measured over a 250 to 1000 micron length scale, especially is at least 1 micron when measured over a 250 to 750 micron scale, and most especially is at least 5 micron when measured over a 700 to 750 micron scale. (That is for example, an Rq of at least 1 micron measured over a 250 to 1000 micron length scale represents a 1 micron average of the square of the deviations in the surface profile from the mean surface or plane, in a field of 250 to 1000 microns that is measured by the instrument.) In one embodiment, the surface roughness, Rq, is from 1 to 11 microns measured over a 250 to 1000 micron scale. In particular it is desirable that the surface roughness, Rq, of the exterior surface of the support member is at least 3 micron when measured over a 500 to 3000 micron length scale, and especially is at least 5 micron when measured over a 700 to 3000 micron length scale. In another embodiment, the exterior surface has a surface roughness, Rq, of at least 3 micron, preferably 3 to 25 micron, and more preferably 5 to 15 micron, on a 700 to 3000 micron length scale. Although the exterior surface can be rough as described above, too rough of an exterior surface may be detrimental to the photosensitive element and impact print performance of the resulting printing element. The support side of the photosensitive element may be embossed or be roughened by an exterior surface of the base member that is too rough, particularly under the typical conditions of pressing contact of the absorbent material to the element during thermal development. Furthermore, increasing the roughness of the surface can reduce the effective area of contact thus compromising the adhesion to the base member and heat transfer. For optimum performance of the system with the photosensitive element, surface roughness may depend upon other properties of the material that forms the surface such as hardness and tackiness. Thus the use of a textured exterior surface having a surface roughness, Rq, as described above, should be balanced against any impact it may have on the element itself. The exterior surface defines a plane containing a plurality of projections and a plurality of pits from the plane. The projections have a height, typically expressed as a positive number, from the plane. The pits have a height, typically expressed as a negative number, from the plane. The exterior surface of the base member is characterized by an average height that represents projections from the plane, wherein on average, the plurality of projections may have an equal or greater height than the plurality of pits, and/or the projections may be an equal or greater number relative to the number of pits. In particular, a plot of a distribution of the deviations from the average height indicates that a larger amount of the deviations are projections above the average surface height. A statistic that describes this feature of a distribution of data is the skew of the distribution. Positive skew statistics indicate a positively skewed distribution, one with a longer tail on the positive side, the magnitude of the skew statistic indicates the degree of deviation from symmetry. A negatively skewed distribution indicates the opposite, an abundance of pits relative to projections. Preferred are symmetric or positively skewed distributions. Most preferred are positively skewed distributions. In one embodiment, the exterior surface has surface roughness containing a plurality of projections and a plurality of pits each having a height relative to the plane, wherein at least 60% of the total range of deviations from the average height are projections above the average surface.

It may also be desirable to characterize the surface topography of the exterior surface of the base member by three dimensional surface structure metrics, such as, for example, number of surface projections per unit area (i.e., density), projection area coverage expressed as a percent, and average projection size (height). In this context, a reference band is defined about the mean surface height or plane. Surface projections that extend above this reference band are defined as projections. Similarly pits that are deeper than the reference band are called pits. The number (or density), height, and size (area) of projections and pits can be determined from the results of the optical profilometry or by other methods known to those skilled in the art. While the applicants do not wish to be held to a particular theory, it is believed that projections extending at least 10 μm (above the reference band of 20 microns) above the surface are beneficial for providing sufficient channels for removal of air entrapped beneath the plate. Additionally, a sufficient average projection surface area is beneficial to provide sufficient tack to keep the plate in place during processing and sufficient thermal contact to facilitate any needed heat transfer. This combination seems to reduce the tendency to form waves or other distributions during thermal processing.

The pattern of grooves, channels, peaks and/or connected cells can be a regular, repeatable pattern, or can be an irregular pattern. The grooves or channels themselves can have a regular or irregular cross section and depth. Similarly the pattern of connected cells, such as a series of gravure cells with connecting channels, can be regular or irregular. The pattern of grooves, channels, peaks, and/or connected cells each form a plurality of macroelements in the exterior surface wherein a recess of at least 20 microns up to 200 microns deep (from the plane of the exterior surface) is created from one macroelement to an adjacent macroelement, i.e., from one groove to the next, and/or one channel to the next, and/or from one cell to the next, and/or from one peak to the next. Where the exterior surface has a pattern that is principally depressions below the median surface, it is desirable that these depressions are connected or end at an edge of the element so that air can be channeled out from under the element and not become trapped in closed cells.

It is also possible for the exterior surface to have a texture that is the pattern of grooves, channels, peaks, or connected cells in combination with, a surface roughness, Rq, of at least 1 micron measured over a 250 to 1000 micron length scale or at least 3 micron when measured over a 500 to 3000 micron length scale. In this case, the macroelements of the pattern have a contacting surface (that is, the exterior surface) with the surface roughness, Rq.

The texture can be incorporated into the exterior surface of the base member, e.g., into the metal support surface of the drum or a flexible support member. Alternatively, the texture can be incorporated into an outermost layer or layers of a modification material on the base member, such that the outermost layer/s form the exterior surface of base member. The texture can be incorporated in the exterior surface (i.e, metal surface or outermost layer/s of modification material) by any means including embossing, typically under pressure; molding, typically prior to curing or solidifying; chemical or photomechanical etching; and engraving with laser radiation. The method of embossing is not limited and can include, applying an embossing tool, such as a roller or platen, to the exterior surface of the base member. The embossing tool may have a patterned surface which embosses the pattern in the exterior surface, or may have smooth surface which can emboss a raised pattern in the exterior surface. The texture can also be applied to the base member by any means known to those skilled in the art of surface coatings, including, but not limited to, incorporating roughening or incompatible materials into a coating material, selective deposition or removal of material during the application, curing, or post treating processes, or using surface energy driven flows to cause local dewetting of a coating resulting in a non-uniform finish. Fillers and particulate, such as, for example, silica, PMMA beads, $TiO_2$ are suitable for use as the roughening component. The roughening component can be incorporated into a carrier, such as a resin or paint, and applied to the base member to create the textured surface. Open-cell foams and closed-cell foams that can become open-celled are also suitable for use in the present invention. One embodiment of forming a textured exterior surface with a modification material is by applying a silicone dispersion with a texturing spray gun. One skilled in the art of surface coating will also recognize that nonuniform surfaces often arise (and may frequently be considered defects such as "orange peel") and are related to application and curing process parameters. Hence, there may be sets of coating processing conditions that can also generate surfaces with the above characteristics. The textured exterior surface can also be formed with a photosensitive material that can undergo a photoimaging process, i.e., be imagewise exposed and treated, to form the pattern texture. Any photosensitive material can be used provided that a suitable texture pattern can be formed in the material and that the material has other suitable properties for use as the modification layer. In one embodiment, a flexographic printing element is used as the photosensitive material, since the flexographic printing element has a relatively thick photopolymerizable layer that can readily form a pattern of suitable recesses in the layer. In this embodiment, the printing element is elastomeric which also provides the base member with suitable resilient surface. Additionally, the photosensitive elastomeric element can inherently provide a suitable tackiness to the exterior surface, particularly if the element is not or only slightly light finished and/or post-exposed. Tack of the exterior surface for the photosensitive elastomeric element that has not been light finished or post-exposed is on the order of 600 grams, and for the photosensitive elastomeric element that has only a low level of light finishing is on the order of about 530 grams.

The surface texture chosen for the exterior surface of the base member may be influenced by the degree of tack of the exterior surface which in turn may depend upon other parameters of the system, such as geometry and/or orientation of the base member and hot roller, the materials of construction particularly taking into account the hardness and thermal conductivity of the materials, the method of mounting the photosensitive element, operational conditions for thermal development, and/or characteristics of the photosensitive elements being developed.

Tack of the exterior surface can be measured with a Tack Tester instrument following procedures outlined in ASTM D2979-01. The instrument includes a plunger having a particular contact area that is pressed against the test surface for a period of time. This "dwell load" is applied over a loading time and then is allowed to stand for a dwell time. The instrument then raises the plunger at a specified speed and records the maximum force (in grams) necessary to break the adhesive bonds and lift the plunger from the test surface. A suitable set of conditions for the tack tester instrument to test the exterior surfaces of the present invention includes a 500 g dwell load, loading time of 4 sec, dwell time of 1 sec, with a plunger having an area of contact that was 0.95 cm in diameter (0.71 cm2 in area), and tensile (separation) speed of 600 mm/min. Note that some of these conditions deviate from those recommended in the ASTM standard test.

The shape of the base member is not limited and can include a drum, roller, platform member, and a planar support such as a tabletop or platen. The base member supports the photosensitive element during thermal processing. The photosensitive element has an interior surface that is adjacent the exterior surface of the base member. The exterior surface of the base member may be integral with the base member. Alternatively, a flexible support member may be located on the base member and thereby form the exterior surface of the base member. The flexible support member can be removably mounted to the base member so that the exterior surface of the base member can be easily replaced as necessary. The flexible support member and its removable mounting on the base member are described in U.S. Publication No. US 2005/0142494. (which priority is from provisional patent application Ser. No. 60/533,711, filed Dec. 31, 2003).

FIG. 1 shows one embodiment of a thermal processor 10. A drum 18 acting as a base member 19 is mounted for rotation on a stationary support frame 12 and rotates in a counter-clockwise direction as indicated by arrow 18a. The base member 19 is non-flexible or substantially non-flexible such that the base member 19 does not significantly change shape during the thermal development process. A photosensitive element 16 is placed on a surface 13 of feed tray 14 and is urged in a direction indicated by arrow 14a. The drum 18 includes a clamp 20 that captures a leading edge of the photosensitive element 16 to mount the element 16 onto the drum.

The clamp 20 and clamp assembly are described in U.S. Pat. No. 6,797,454, particularly relative to FIGS. 1 through 5. The clamp 20 is flush mounted transversely on an exterior surface 22 of the drum 18. A cross-section of a tooth of the clamp 20 traversing a recessed area 20a is shown in FIG. 1. In one embodiment, the clamp 20 is elongated and has a plurality of teeth extending tangentially in a direction opposite the direction of rotation 18a of the drum 18. The clamp 20 may extend the full width of the element 16. In operation, the clamp 20 is raised radially outward and off of the outer surface 22 of the drum 18 by an actuator means. The actuator means lift the clamp 20 to a height sufficient to provide enough clearance to insert the leading edge of the element 16 between the clamp 20 and the recessed area 20a for the clamp 20 on the drum 18. The clamp assembly retracts the clamp 20 to tightly grip the leading edge of the element 16 and hold the element 16 in place on the outer surface 22 of the drum 18.

In one embodiment, the outer surface 22 of the drum 18 is the exterior surface of the base member having a texture that is adjacent the interior surface of the photosensitive element 16. In this embodiment, the outer surface 22 of the drum may include at least one layer of a modification material as described below.

In the embodiment shown in FIG. 1, a flexible support member 118 is mounted onto the outer surface 22 of the drum 18 in order to support the photosensitive element 16 during thermal development. The flexible support member has an interior surface adjacent the outer surface 22 of the drum 18 and opposite the interior surface, is the exterior surface 120 having texture. The base member 19 is a cylindrically-shaped support for the support member 118. The flexible support member 118 may directly contact the outer surface 22 of the drum 18, or there may be one or more layers of material intermediate the support member 118 and the drum 18. The support member 118 is flexible such that the member 118 conforms to the shape of the underlying base member 19, which in this embodiment is the drum 18. As such, the exterior surface 120 of the flexible support member supports the photosensitive element 16 through heating of the element 16 and for delivering the element to an absorbent material 35. The interior surface of the element 16 remains substantially in contact with the exterior surface 120 of the support member 118 during processing.

Figure 2A:
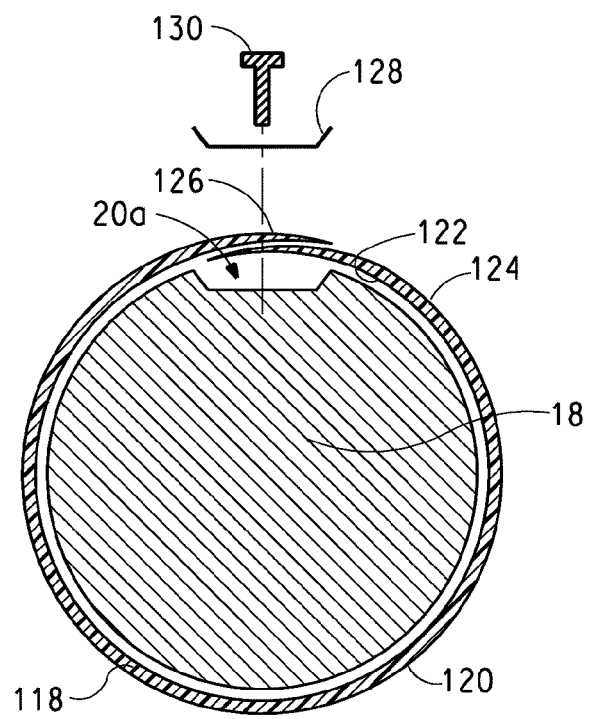
FIG. 2a is a schematic cross-sectional side view of an embodiment of the flexible support member wrapped about the drum.
Figure 2B:
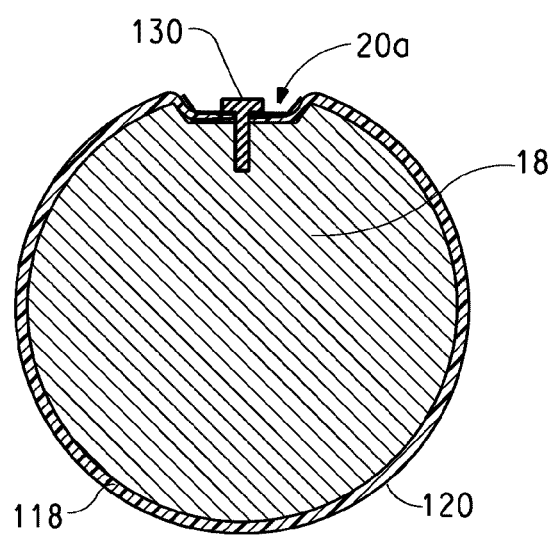
FIG. 2b is a schematic cross-sectional side view of the flexible support member in tension on the drum.

Referring to FIGS. 2A and 2B, the flexible support member 118 includes a carrier 122 and may have at least one layer 124 of material applied to one or both sides of the carrier. In one embodiment where the carrier 122 includes the layer on one side, the support member 118 is mounted to the drum 18 such that a side of the carrier 122 opposite the layer/s 124 is adjacent the outer surface 22 of the drum 18. The support member 118 has a length suitable to wrap about the outer surface 22 of the drum 18 such that two opposite ends 126 of the support member 118 mate or overlap for secure mounting to the drum 18. At each end of the opposite ends 126 of the support member 118 is a plurality of openings (not shown) that mate when the opposite ends 126 are overlapped. A bar member 128 also having a plurality of openings to mate with the openings in the ends 126 secures and tensions the support member 118 to the drum 18. Fasteners, such as bolts 130, are located through the openings in the bar member 128 and then through the mated openings in the support member 118 and secured into a recessed area 20a for the clamp 20 on the drum 18. The bar member 128 can be the same or substantially the same length as an axial length of the drum 18. In one embodiment, the bar member 128 is about 2 inches shorter than the axial length of the drum 18 and support member 118 and is shaped to fit into the recessed area 20a for the clamp 20. As shown in FIG. 2b, when the fasteners or bolts 130 are secured into the drum 18 the bar member 128 tightens the support member 118 about the circumference of drum thereby tensioning the support member 118 into contact with the outer surface 22 of the drum 18. The support member 118, bar member 128, and the bolts 130 are located within the recessed area 20a so as not to interfere with the clamp 20 and clamp assembly that holds the leading edge of the photosensitive element 16. This location also precludes their interference with the hot roll 38 or nip 60. For example, the fasteners or bolts 130 (and openings) are located between teeth of the clamp 20. The clamp 20 is thus still able to function when the support member 118 is secured to the drum 18.

When the support member 118 is tensioned to the drum 18, heat transfer between the drum, support member including any layers 124 present on the carrier 122 is promoted. It is within the skill of those in the art to understand that there are alternate methods for securing in tension the support member 118 to the exterior surface 22 of the drum 18 in addition to the described embodiment depicted in FIGS. 2A and 2B.

The support member 118 has a width (side-to-side) that covers or substantially covers an entire width of the drum 18. In one embodiment, tensioning the support member 118 to the drum 18 is sufficient to retain the support member to the drum without the need to secure each side of the support member to the exterior surface 22 of the drum as well. It may be desired to attach the sides of the support member 118 to the drum 18 by any means conventional in the art to secure the support member in place, but yet maintain the capability to remove the support member as needed.

The carrier 122 is a sheet that can be made of any material having suitable thermal conductivity and mechanical strength to function in the present thermal development process. The material for the carrier 122 should also be one that can adhere a layer 124 of a modification material. In one embodiment, the carrier 122 is metal, preferably aluminum, but can also be made of stainless steel, galvanized steel, or other metals. Other materials suitable for use as the carrier 122 include a polymeric film, such as polyester and polyimide; fiber reinforced polymeric film; and composite materials. In addition to the above characteristics, the carrier 122 should be dimensionally stable and resistant to heat associated with the present thermal development process. In one embodiment, the carrier 122 includes on the exterior side 120 at least one layer 124 of a modification material.

The at least one layer 124 of modification material can be a resilient layer, or a tacky layer, or a resilient layer and a tacky layer on the resilient layer, or a single layer that provides both resiliency and tackiness. The tacky layer can also function as a protective layer to an underlying resilient layer. Alternatively, a protective layer can be interposed between the resilient layer and the tacky layer. The resilient layer can be composed of any material to suitable to provide a Shore A hardness between about 30 and about 75, such as natural rubbers and elastomeric materials and synthetic rubbers and elastomeric materials, including rubber, silicone rubber, and compressible foams. Particularly preferred are silicone rubber and rubber. The hardness of the layer 124 is important, although not critical to the invention. The resilient surface provided by the resilient layer can result in a longer nip zone as a result of the surface deflecting under the pressure exerted by the hot roll 38. The rubber elasticity also accommodates some minor misalignment between the drum 18 and a hot roll 38. The resilient layer can include metal particles, such as aluminum particles, to improve the heat transfer characteristics of the support member by between 10-20 percent.

The tacky layer can be of any suitable material in order to provide the necessary adhesiveness to retain the photosensitive element on the support member 118 as the drum 18 rotates, and yet allow for the release of the element from the drum after development is completed. A test can be conducted to determine if a surface has tackiness suitable for use in the present invention. A suggested test involves placing a relatively small portion (about 3 in.×3 in., about 7.6 cm×7.6 cm) of a photosensitive element onto the tacky surface of the support member 118 positioned on the drum 18, orienting the drum so that gravity will tend to pull the portion off the support member 118, and determining the time the portion remains on the tacky surface. If the portion remains on the support member 118 for at least 3 seconds while gravity oriented, the surface is suitably tacky for use in the present invention. The tackiness of the tacky layer is relatively low, that is, the element 16 should be easily removable from the drum 18 after development, unlike removal of a printing plate adhesively mounted onto a printing cylinder. In addition to the tacky layer having a releasable adhesiveness for the photosensitive element, the selection of the material for the tacky layer may also be driven by the selection of the material for the underlying layer. The tacky layer must adhere to the underlying resilient layer, or an underlying protective layer on the resilient layer, or even the carrier layer. When the underlying resilient layer is silicone rubber, a preferred material for the tacky layer is a silicone-based material, such as Dow Corning 236 dispersion. Finally, the need to impart a texture to the exterior layer may have an impact on the materials selected. Likewise, the chosen texture can impact the effective tack of the surface.

It is contemplated that the carrier 122 may also have one or more additional layers on the opposite side of the sheet. The layer or layers on the opposite side may have the same purpose as the layer/s 124 on the one side of the sheet. As such, the support member 118 having the same layer/s 124 on each side is reversible and can be flipped over for use before being discarded provided that the outermost layer this side also has texture. The layer or layers on the opposite side may be useful for other purposes such as improving the heat transfer between carrier and drum surface, maintaining the position of the carrier for mounting or during operation with for example, an adhesion layer, to avoid shifting or lifting of the carrier, cushioning the element 16. However, the more layers present on the carrier 122, the more difficult it may be to maintain thermal transfer conditions between the base member 19 and the support member 118 to the photosensitive element 16. It is also contemplated that more than one flexible support members 118 may be mounted to the base member 19. Each of the more than one flexible support members 118 may be the same or different relative to layer 124 and carrier 122.

The layer or layers 124 can be applied to the carrier 122 or to the outer surface 22 in any manner suitable to provide the necessary texture of the modification material or materials on the support member 118. A conventional method for applying a silicone rubber as the resilient layer includes extruding the rubber to form a layer on the carrier, heating in an autoclave to cure the rubber, and then grinding an exterior surface of the rubber to the desired layer thickness. Alternatively, a calendered rubber sheet layer may be laminated to the carrier. The tacky layer can be spray or roll coated onto the resilient layer or directly onto the base member. The thickness of the carrier 122 is between 0.005 to 0.250 in. (0.0127 to 0.635 cm), preferably 0.015 to 0.025 in. (0.038 to 0.064 cm). The thickness of the resilient layer on the carrier is 0 to 0.750 in. (0 to 1.91 cm), preferably 0.10 to 0.30 in. (0.25 to 0.76 cm). The thickness of the tacky coating is 0 to 0.050 in. (0 to 0.127 cm), preferably 0.003 to 0.013 (0.008 to 0.33 cm).

In operation, the flexible support member 118 with the base member 19 function as a unitary structure to support the photosensitive element 16 during thermal development. Yet the flexible support member 118 is capable of being removed from the base member 19 as needed primarily for maintenance of the processor 10, and particularly to replace the support member 118 or one or more of the layers 124 on the support member 118. The support member 118 by its removability from the base member 19, separates the function of the layer or layers 124 from the function of the base member 19 to deliver the photosensitive element 16 to an absorbent material. The removable support member 118 provides for the replacement of the modification layer/s 124 on the carrier 122 as the layer/s become worn with use.

Thermal development includes heating of an exterior surface 17 of the photosensitive element 16 to a temperature sufficient to cause a portion of the composition layer to liquefy at temperature. The composition layer may also be identified as a photopolymerizable layer. The photosensitive element 16 containing the composition layer (and any additional layer/s if present) can be heated by conduction, convection, radiation or other heating methods to a temperature sufficient to effect melting, softening, or liquefying of the uncured portions but not so high as to effect distortion of the cured portions of the layer. One or more additional layers disposed above the composition layer may soften or melt or flow and be absorbed as well by an absorbent material. The photosensitive element is heated to a surface temperature above about 40° C., preferably from about 40° C. to about 230° C. (104-446° F.) in order to effect melting or flowing of the uncured portions of the composition layer. The thermal treating steps of heating the photosensitive element 16 and contacting an outermost surface of the element with an absorbent material can be done at the same time, or in sequence provided that the uncured portions of the composition layer are still soft or in a melt state when contacted with the absorbent material.

The drum 18 may also be equipped with a heater 24, which is provided to keep the photosensitive element 16 at a stable starting temperature independent of the surrounding environment. Any means of heating the drum 18 is acceptable, as long as the power capacity of the heater is sufficient to maintain a fairly constant selected skin temperature of the exterior surface 120. The means for heating the drum is capable of heating the drum 18 to a temperature capable of heating the exterior surface 17 of the composition layer. The heater 24 may be an electrical heating blanket, such as a wire wound blanket. If the normal operating environment is carefully controlled to be at a constant temperature, the heater can be turned off or omitted from the apparatus. As is disclosed in U.S. Pat. No. 6,797,454 B1, it is also possible that the drum be cooled by cooling means, such as, a blower directing a stream of air at the surface of the photosensitive element and the drum and/or by the circulating of cooling fluid beneath the surface of the drum 18 to cool the element 16. It should be understood that such cooling means could also cool the support member 118. It is also contemplated that a heating fluid, such as water, may be circulated beneath the surface of the drum 18 to heat the element 16. The temperature of the exterior surface 22 of the support member 118 mounted on the drum is about 50 to 150° F. (10 to 65.6° C.), preferably 75 to 95° F. (23.9 to 35° C.).

Located adjacent the drum 18 is a first heating means comprising a heater 30 which, in the embodiment illustrated, is a focused radiant heater directed at an exterior surface 17 of the photosensitive element 16. The heater 30 elevates the temperature of the exterior surface 17 of the composition layer. In one embodiment, the heater 30 elevates the temperature of the surface 17 of the composition layer to a temperature sufficient to melt or soften the unirradiated portion of the composition layer, causing a portion of the layer to liquefy. The heater 30 applies heat to the exterior surface 17 of the composition layer. In the embodiment illustrated, the heater 30 comprises a plurality of tubular infrared heating bulbs, such as bulbs 31 mounted in end supports, such as support 32, that also provide electrical connections to the bulbs 31. Adjacent the side of the bulbs 31 opposite drum 18 is a reflector 33 that acts to focus and direct the infrared radiation toward the exterior surface 17 of the photosensitive element sheet 16. An alternate embodiment of the heater 30 uses one tubular infrared heating bulb 31 mounted in the end supports 32 with the reflector 33.

The thermal processor 10 includes a delivery means for feeding a continuous web 35 of absorbent material, which in the preferred embodiment contacts a hot roller 38. A second means for heating includes the hot roller 38. The hot roller 38 is positioned adjacent the drum 18 which carries the photosensitive element 16. The hot roller 38 is also adjacent the heater 30, and the hot roller 38 maintains or further elevates the temperature of the exterior surface 17 of the composition layer. The hot roller 38 applies heat to the exterior surface 17 of the photosensitive element 16. The absorbent web 35 is unwound from a supply roll 40 and passes between rolls 41 and 42 in a serpentine path. The web 35 is then guided over the hot roller 38 and over rolls 43 and 44. One or more of the rolls 41, 42, 43, 44, as well as take up roll 45 may drive the web 35. One or more of the rolls 41, 42, 43, 44, and even the supply roll 40 may include a braking mechanism to maintain tension of the web in its transport path. The web 35 is then wound up on the take up roll 45.

The processor 10 is provided with a means for relative motion between the drum 18 and the hot roller 38, so that the photosensitive element 16 and the web 35 of absorbent material can be brought into contact with the other. Means for providing relative movement can be accomplished, for example, by mounting the hot roller 38 (and/or drum 18) onto arms 47 attached to a beam 48 that moves the hot roller 35 under the urging of one or more actuators 49. Suitable for use as one or more actuators 49 can be air cylinders, or stepping motors, or servo motors. Temperature sensors may be mounted throughout the processor to monitor the temperature for the purpose of controlling the heating elements in the drum 18, hot roller 38, and radiant heater 30.

The nip 60, or distance between the surface of the hot roller 38 and the surface of the drum 18, when the hot roller 38 is in the engaged position for this embodiment, is zero centimeters or less. It is desirable to set the distance such that a substantially uniform pressure is applied to the nip area of the exterior surface of the sheet 16 during processing. Pressure is applied to force the absorbent web into intimate contact with the photosensitive element 16. Pressure between about 0.70 kilograms per square centimeter and about 24 kilograms per square centimeter, preferably between about 2 kilograms per square centimeter and about 12 kilograms per square centimeter in the nip area is adequate to enhance the absorption from the sheet surface to the absorbent web without distorting the composite photosensitive element.

The radiant heater 30 acting as a first heating means, the hot roller 38 acting as a second heating means, and the drum heater 24 acting as a third heating means, independently or in any combination, are capable of heating the exterior surface 17 of the photosensitive element 16 to a temperature sufficient to cause a portion, i.e., an unirradiated portion, of the composition layer to liquefy. The first heating means, the second heating means, and the third heating means independently or in any combination constitute a heating station 50. A preferred heating station 50 includes the first heating means and the second heating means.

The operation of the apparatus for the process of thermally developing the photosensitive element 16 is described in reference to FIG. 1. The plate processor 10 is in a home position with the drum 18 stationary with the clamp 20 positioned near the top of the drum adjacent the feed tray 14. The support member 118 having a textured exterior surface was previously mounted onto the outer surface 22 of the drum 18. The operator places the photosensitive element 16 on feed tray 14. An operator then opens clamp 20 and engages the leading edge 24 of the element 16 in clamp 20. The drum heater 24 or the IR heater 30 may be used to preheat the drum 18. The cartridge heater (not shown) for the hot roll 38 is used to preheat the hot roll. The drum 18 starts turning and carries the element 16 with it so that the photosensitive element 16 is adjacent the support member 118, such that the interior surface of the element resides on the textured exterior surface 120 of the base member 19. The heater 30 may preheat the bulbs 31 before the element 16 reaches the heater 30, and then switch to an operating setting to achieve the desired temperature for melting, softening or liquefying the composition layer on the element 16. As the leading edge of the element 16 reaches the position where the hot roll 38 will contact the drum 18, the actuators 49 move the hot roll 38 carrying the absorbent web 35 against the element 16. The photosensitive element composition layer is heated to between 40 and 230° C. (104 and 392° F.). while in contact with the absorbent material. The absorbent material contacts the exterior surface of the composition layer of the heated photosensitive element 16, and absorbs the liquefied portions of the polymer from the unirradiated portions of the composition layer, forming a relief pattern or surface suitable for use as a flexographic printing form. By maintaining more or less intimate contact of the absorbent material with the composition layer that is molten in the uncured regions, a transfer of the uncured photosensitive material from the composition layer to the absorbent material takes place. While still in the heated condition, the absorbent material is separated from the cured photosensitive element 16 to reveal the relief structure.

As the trailing edge of the element 16 passes the hot roll/drum contact point, i.e., nip, the heater 30 may cool down or turn off, the actuator 49 will retract the hot roll 38, and the web 35 will be stopped. The drum 18 may return the leading edge of the element 16 to the home position to begin another cycle of heating and contacting. A cycle of the steps of heating the element 16 to liquefy the composition layer and contacting the molten (portions) layer with the absorbent material can be repeated as many times as necessary to adequately remove the uncured material and create sufficient relief depth. However, it is desirable to minimize the number of cycles for suitable system performance, and typically the photopolymerizable element is thermally treated for 5 to 15 cycles. Intimate contact of the absorbent material to the composition layer (while the uncured portions are melting or liquefying) may be maintained by the pressing the layer and the absorbent material together.

Photosensitive Element

The present invention is not limited to the type of element that is thermally processed. In one embodiment, the photosensitive element 16 includes a flexible substrate and a composition layer mounted on the substrate. The composition layer is at least one layer on the substrate capable of being partially liquefied. Preferably, the photosensitive element 16 is an elastomeric printing element suitable for use as a flexographic printing form. The at least one layer on the substrate is preferably a photosensitive layer, and most preferably a photopolymerizable layer of an elastomeric composition wherein the photosensitive layer can be selectively cured by actinic radiation. As used herein, the term "photopolymerizable" encompasses systems that are photopolymerizable, photocrosslinkable, or both. In cases where the composition layer comprises more than one photosensitive layer on the flexible substrate, the composition of each of the photosensitive layers can be the same or different from any of the other photosensitive layers.

The layer of the photosensitive composition is capable of partially liquefying upon thermal development. That is, during thermal development the uncured composition must soften or melt at a reasonable processing or developing temperature. At least the exterior surface of the composition layer is heated to a temperature sufficient to cause a portion of the layer to liquefy, soften or melt.

The photosensitive layer includes at least one monomer and a photoinitiator, and optionally a binder. The at least one monomer is an addition-polymerizable ethylenically unsaturated compound with at least one terminal ethylenic group. Monomers that can be used in the photosensitive layer are well known in the art and include monofunctional acrylates and methacrylates, multifunctional acrylates and methacrylates, and polyacryloyl oligomers. Further examples of monomers can be found in U.S. Pat. Nos. 4,323,636; 4,753,865; and 4,726,877. A mixture of monomers may be used.

The photoinitiator is a compound that generates free radicals upon exposure to actinic radiation. Any of the known classes of photoinitiators, particularly free radical photoinitiators may be used. Alternatively, the photoinitiator may be a mixture of compounds, one of which provides the free radicals when caused to do so by a sensitizer activated by radiation.

The optional binder is a preformed polymer that serves as a matrix for the monomer and photoinitiator prior to exposure and is a contributor to the physical properties of the photopolymer both before and after exposure. In one embodiment the optional binder is elastomeric. A non-limiting example of an elastomeric binder is an A-B-A type block copolymer, where A represents a nonelastomeric block, preferably a vinyl polymer and most preferably polystyrene, and B represents an elastomeric block, preferably polybutadiene or polyisoprene. Other suitable photosensitive elastomers that may be used include polyurethane elastomers, such as those described in U.S. Pat. Nos. 5,015,556 and 5,175,072. The monomer or mixture of monomers must be compatible with the binder to the extent that a clear, non-cloudy photosensitive layer is produced.

Additional additives to the photosensitive layer include colorants, processing aids, antioxidants, and antiozonants. Processing aids may be such things as low molecular weight polymers compatible with the elastomeric block copolymer. Antiozonants include hydrocarbon waxes, norbornenes, and vegetable oils. Suitable antioxidants include alkylated phenols, alkylated bisphenols, polymerized trimethyldihydroquinone, and dilauryl thiopropinoate.

The photosensitive element may include one or more additional layers on the side of the photosensitive layer opposite the substrate. Examples of additional layers include, but are not limited to, a release layer, a capping layer, an elastomeric layer, a laser radiation-sensitive layer, a barrier layer, and combinations thereof. The one or more additional layers preferably are removable, in whole or in part, by contact with the absorbent material in the range of acceptable developing temperatures for the photosensitive element used. One or more of the additional other layers can cover or only partially cover the photosensitive composition layer. An example of an additional layer which only partially covers the photosensitive composition layer is a masking layer that is formed by imagewise application, e.g., ink jet application, of an actinic radiation blocking material or ink.

The release layer protects the surface of the composition layer and enables the easy removal of a mask used for the imagewise exposure of the photosensitive element. Materials suitable as the release layer are well known in the art. Suitable compositions for the capping layer and methods for forming the layer on the element are disclosed as elastomeric compositions in a multilayer cover element described in Gruetzmacher et al., U.S. Pat. Nos. 4,427,759 and 4,460,675. The elastomeric capping layer is similar to the photosensitive layer in that after imagewise exposure the elastomeric capping layer is at least partially removable by contact with the absorbent material in the range of acceptable temperatures for the photosensitive element used.

In one embodiment, the laser radiation sensitive layer is sensitive to infrared laser radiation, and thus may be identified as an infrared-sensitive layer. The laser radiation sensitive layer can be on the photosensitive layer, or on a barrier layer which is on the photosensitive layer, or on a temporary support which together with the photosensitive element form an assemblage. Each of the release layer and elastomeric capping layer can function as the barrier layer when the release and/or capping layer/s is disposed between the infrared-sensitive layer and the photosensitive layer. The infrared-sensitive layer can be ablated (i.e., vaporized or removed) from the photosensitive layer on the side opposite the flexible substrate by exposure to infrared laser radiation. Alternatively, when the photosensitive element forms an assemblage with the support carrying the infrared-sensitive layer, the infrared-sensitive layer can be transferred from the temporary support to the external surface (the side opposite the flexible substrate) of the photosensitive layer by exposure to infrared laser radiation. The infrared-sensitive layer can be used alone or with other layers, e.g., ejection layer, heating layer, etc.

The infrared-sensitive layer generally comprises an infrared-absorbing material, a radiation-opaque material, and an optional binder. Dark inorganic pigments, such as carbon black and graphite, generally function as both infrared-sensitive material and radiation-opaque material. The thickness of the infrared-sensitive layer should be in a range to optimize both sensitivity and opacity to actinic radiation (e.g., has an optical density of $\geq 2.5$). Such infrared-sensitive photoablative or phototransferable layer can be employed in digital direct-to-plate image technology in which the exposure by laser radiation removes or transfers the infrared-sensitive layer to form an in-situ mask on the photosensitive element. Suitable infrared-sensitive compositions, elements, and their preparation are disclosed in U.S. Pat. Nos. 5,262,275; 5,719,009; 5,607,814; 5,506,086; 5,766,819; 5,840,463; and EP 0 741 330 A1. The infrared-sensitive layer preferably is removable by contact with the absorbent material in the range of acceptable developing temperatures for the photosensitive element used.

The photosensitive element of the present invention may further include a temporary coversheet on top of the uppermost layer of the photosensitive element. One purpose of the coversheet is to protect the uppermost layer of the photosensitive element during storage and handling. Depending upon end use, the coversheet may or may not be removed prior to imaging, but is removed prior to development. Suitable materials for the coversheet are well known in the art.

The substrate is selected to be tear resistant and must have a fairly high melt point, for example, above the liquefying temperature of the composition layer formed on the substrate. The material for the substrate is not limited and can be selected from polymeric films, foams, fabrics, and metals such as aluminum and steel. The substrate can be almost any polymeric material that forms films that are non-reactive and remain stable throughout the processing conditions. Examples of suitable film supports include cellulosic films and thermoplastic materials such as polyolefins, polycarbonates, and polyester.

The substrate of the photosensitive element has a thickness of between about 0.01 mm and about 0.38 mm. The radiation curable composition layer is between about 0.35 mm and about 7.6 mm thick, with a preferred thickness of about 0.5 mm to 3.9 mm (20 to 155 mils).

The photosensitive element 16 is prepared for thermal development by imagewise exposing the element 16 to actinic radiation. After imagewise exposure, the photosensitive element 16 contains cured portions in the exposed areas of the radiation curable composition layer and uncured portions in the unexposed areas of the radiation curable composition layer. Imagewise exposure is carried out by exposing the photosensitive element through an image-bearing mask. The image-bearing mask may be a black and white transparency or negative containing the subject matter to be printed, or an in-situ mask formed with the laser radiation sensitive layer on the composition layer, or other means known in the art. Imagewise exposure can be carried out in a vacuum frame or may be conducted in the presence of atmospheric oxygen. On exposure, the transparent areas of the mask allow addition polymerization or crosslinking to take place, while the actinic radiation opaque areas remain uncrosslinked. Exposure is of sufficient duration to crosslink the exposed areas down to the support or to a back exposed layer (floor). Imagewise exposure time is typically much longer than backflash time, and ranges from a few to tens of minutes.

For direct-to-plate image formation as disclosed in U.S. Pat. Nos. 5,262,275; 5,719,009; 5,607,814; 5,506,086; 5,766,819; 5,840,463 and EP 0 741 330 A1 the image-bearing mask is formed in-situ with the laser radiation sensitive layer using an infrared laser exposure engine. The imagewise laser exposure can be carried out using various types of infrared lasers, which emit in the range 750 to 20,000 nm, preferably in the range 780 to 2,000 nm. Diode lasers may be used, but Nd:YAG lasers emitting at 1060 nm are preferred.

Actinic radiation sources encompass the ultraviolet, visible and infrared wavelength regions. The suitability of a particular actinic radiation source is governed by the photosensitivity of the initiator and the at least one monomer used in preparing the flexographic printing plates from the photosensitive element. The preferred photosensitivity of most common flexographic printing plates is in the UV and deep visible area of the spectrum, as they afford better room-light stability. The portions of the composition layer that are exposed to radiation chemically cross-link and cure. The portions of the composition layer that are unirradiated (unexposed) are not cured and have a lower melting or liquefying temperature than the cured irradiated portions. The imagewise exposed photosensitive element 16 is then ready for heat development with the absorbent material to form a relief pattern.

An overall back exposure, a so-called backflash exposure, may be conducted before or after the imagewise exposure to polymerize a predetermined thickness of the photopolymer layer adjacent the support. This polymerized portion of the photopolymer layer is designated a floor. The floor thickness varies with the time of exposure, exposure source, etc. This exposure may be done diffuse or directed. All radiation sources suitable for imagewise exposure may be used. The exposure is generally for 10 seconds to 30 minutes.

Following overall exposure to UV radiation through the mask, the photosensitive printing element is thermally developed as described above to remove unpolymerized areas in the photopolymerizable layer and thereby form a relief image. The thermal development step removes at least the photopolymerizable layer in the areas which were not exposed to actinic radiation, i.e., the unexposed areas or uncured areas, of the photopolymerizable layer. Except for the elastomeric capping layer, typically the additional layers that may be present on the photopolymerizable layer are removed or substantially removed from the polymerized areas of the photopolymerizable layer.

The absorbent material is selected having a melt temperature exceeding the melt or softening or liquefying temperature of the unirradiated or uncured portions of the radiation curable composition and having good tear resistance at the same operating temperatures. The absorbent material may also be referred to herein as development medium, web, or absorbent web. Preferably, the selected material withstands temperatures required to process the photosensitive element during heating. The absorbent material is selected from non-woven materials, paper stocks, fibrous woven material, open-celled foam materials, porous materials that contain more or less a substantial fraction of their included volume as void volume. The absorbent material can be in web or sheet form. The absorbent material should also possess a high absorbency for the molten elastomeric composition as measured by the grams of elastomer that can be absorbed per square millimeter of the absorbent material. It is also desirable that fibers are bonded in an absorbent material so that the fibers are not deposited into the plate during development. A non-woven web is preferred.

After thermal development, the flexographic printing form may be post exposed and/or chemically or physically after-treated in any sequence to detackify the surface of the flexographic printing form.

EXAMPLES

In the following examples, a CYREL® FAST thermal processor was used with the conditions as noted. CYREL® FAST thermal processor and CYREL® flexographic printing plates are all available from The DuPont Company (Wilmington, Del.). CYREL® flexographic printing plates, types FD1, FDX, and DFH use polyethylene terephthalate (PET) base support for the photopolymerizable layer.

Example 1

The following example demonstrates the effect of a textured surface having a pattern of channels, grooves, peaks, or connected cells, for supporting a photosensitive element during thermal development.

All plates tested in this example were CYREL® flexographic printing plates, type FD1, 67 mils (0.170 cm). The plates were exposed and thermally processed as described below. The plates were blanket exposed through the support (backside exposure) and imagewise exposed through a phototool having a mask image, to ultraviolet radiation on a CYREL® exposure unit, prior to thermal development.

An exterior surface of a drum of the FAST processor that supports the photosensitive element was textured. The exterior surface was textured by coating with a 45 Shore A hardness rubber that was vulcanized and then ground to a nominal thickness of about 0.189 in (0.48 cm). The rubber layer was coated with Dow 236 silicone dispersion to form a layer by manually spraying with a spray gun while the drum rotated. The silicone dispersion was applied such that the thickness of the dried layer would be at least about 5 mils (0.0127 cm). The Dow 236 silicone dispersion formed a white layer on the rubber layer, which was the exterior surface of the drum. But while the white layer was drying, the exterior surface of the drum was contacted with a metal roller having a fine diamond cut pattern on its surface. The metal roller and the drum were pressed into contact as the roller and the drum rotated, thereby impressing or embossing the diamond pattern of the metal roller into the white layer of the drum. Since the metal roller had a width less than the width of the drum, the metal roller translated its position along the axial length of the drum and the pressing was repeated, so that the entire exterior surface of the drum was embossed with the diamond pattern. The white layer dried (removing solvent in dispersion) and retained the embossed pattern as a knurled or textured surface on the drum. The textured surface on the drum was at least a pattern of grooves and channels. Since the embossing method was not highly controlled, the grooves and channels that were formed varied in depth on the exterior surface. In some areas, the depth of the grooves and channels were to the underlying rubber layer, and in other areas, the depth of the grooves and channels were only in the white layer. Because the white layer was embossed while wet or substantially wet, peaks in the surface may also have formed. The groove or channel depth likely varied from about 3 mils (0.00762 cm) to as much as 9 to 10 mils (0.023 to 0.025 cm). During thermal processing, the white layer had sufficient tackiness to hold the plate on the rotating drum.

The existing drum in a commercially available CYREL® FAST TD1000 processor was replaced with the above drum with the textured surface. The CYREL® 67FD1 plate was mounted onto the textured surface of the drum so that the support side of the plate was adjacent the exterior surface and a leading edge of the plate was clamped to the drum. The plate was processed in the FAST processor according to established operating conditions for commercial units. The processor operating conditions were the temperature of a hot roll of 325° F. (162.8° C.), the temperature of the drum set to 88° F. (31.1° C.), preheating the plate (prior to contact with the development medium backed by the hot roll) by infrared heating elements at a maximum of 80% power, and a maximum pressure applied to the plate by the hot roll was 78 psi (5.48 kgs/sq. cm). The plate was processed for 11 cycles, that is 11 cycles of heating the plate, contacting the plate with the development medium, and removing the development medium occurred, in order to form desired relief. The conditions for each cycle were varied as dictated by the established operating method for the thermal processor. The plate was removed, and 11 more FD1 plates were processed as described above. The plates were evaluated for chevrons (waves) and the results are reported in Table 1.

As a comparative, FD1 plates were thermally processed in the same commercial FAST processor but using the existing drum (the drum which came with the processor). The existing drum was also provided with the rubber layer and the white layer as described above for the textured drum. However, the existing drum did not undergo the embossing process. The white layer was not altered or impressed while it cured in air to drive off the solvent until dry. The exterior surface of the existing drum had no visibly apparent pattern formed in surface. Six 67FD1 plates were sequentially mounted and processed in the FAST processor using the same operating conditions described above. The comparative plates were evaluated for chevrons (waves) and the results are in Table 1.

TABLE 1

| Drum Surface | Total Number of Plates Processed | Count of plates with | | | Plates Having No Chevrons |
|---|---|---|---|---|---|
| | | Severity 3 | Severity 2 | Severity 1 | |
| Smooth | 6 | 1 | 3 | 2 | 0 |
| Textured | 12 | 0 | 0 | 3 | 9 |

After thermal processing each plate was evaluated for the occurrence of chevrons and severity of the chevron/s. Chevrons, or waves, are localized distortions resulting in a non-planar topography of the photosensitive element. A chevron or wave may appear as V-shaped, diagonal, or straight lines of bump/s or distortion/s on the plate surface or in the bulk of the photopolymer layer of the plate or even in the support of the plate. Chevrons or waves are generally created as a result of non-uniform strains imparted in the plate (photosensitive element) while the support is at a temperature higher than the glass transition temperature resulting in deformations that remain after the element has cooled or returned to room temperature.

The occurrence and severity of the chevrons or waves were evaluated by visual observation of all the plates using the same person. Of the plates having chevrons, plates having a severity of 1 are considered commercially acceptable, whereas a severity rating of a 2 or 3 is considered too severe and generally results in a printable defect. The severity count is the number of plates with a chevron of the particular severity. Of the plates thermally processed on the textured drum surface, 9 plates did not have any chevrons or waves, and of the remaining 3 the severity level was low enough to be considered commercially acceptable for printing. All of the 6 comparative plates thermally processed on the existing drum surface had some level of chevrons or waves, with more than half as being too severe for printing.

The results demonstrated that thermally processing photosensitive printing elements on the textured drum surface having grooves and/or channels reduced the occurrence of chevrons or waves in the resulting printing plates.

Example 2

The following example demonstrates the effect of a textured surface having surface roughness, Rq, for supporting a photosensitive element during thermal development.

All plates tested in this example were CYREL® flexographic printing plates, type FDX, 67 mils (0.17 cm). All the plates were blanket exposed through the support (backside exposure) and imagewise exposed through a test target having a mask image, to ultraviolet radiation on a CYREL® exposure unit, prior to thermal development. The plates were imaged by one of two test targets for the imagewise exposure. Using one of the targets (T1), multiple plates were imaged and thermally processed on each of three flexible support surfaces, and the average of the plate evaluations was reported in Table 2B. For each of the flexible support surfaces, one plate was imaged with the second target (T2) and thermally processed. The targets were designed to accentuate wave and crease defects in the printing plate element.

Each of three flexible support members was coated on one side with a rubber layer, vulcanized and ground as described in Example 1. The rubber layer was coated with Dow Corning® 1200 Prime Coat and then coated with Dow 236 silicone dispersion to form a smooth white layer by manually spraying (with a spray gun). One of the flexible support members having only the rubber layer, prime coat, and smooth white layer, was used as the control for testing of the plates. The exterior surface of the other two flexible support members was textured by applying another layer of the same Dow 236 dispersion (on top of the smooth white layer) using a texturing gun available from most major suppliers of spray coating equipment. The texturing guns are different from conventional spray guns in that the texturing gun includes at least an adjustment for atomizing pressure. By reducing the atomizing pressure larger droplets of the dispersion are sprayed. The surface texture of the two flexible support members was changed by adjusting the process conditions (atomizing pressure) used to apply the second white silicone dispersion. The process parameters with the texturing gun were varied until the desired textured was obtained. The exterior surface of the two textured flexible support members was analyzed for surface characteristics and reported as Texture 2 and Texture 3 in Table 2A.

As a control for the surface characterization, representative samples of the exterior surface of prior art drums from thermal processors were tested for surface characteristics. The exterior surface of the prior art drums had the rubber layer with prime and smooth coats (without the texturing layer) and was formed as described above for the Control flexible support member.

The exterior surface of the two textured flexible support members and the control samples were measured with an optical interferometer that was a Zygo NewView 5000 equipped with a variety of different size scales as reported in below. Data analysis was conducted using Zygo MetroPro Analysis Software version 7.9.0. Equipment and software manufactured by Zygo Corporation, Middlefield, Conn. Samples were measured at a variety of different size scales from 70 μm to 1 cm. The size scale, or length of scale, is the field of measurement used by the Zygo instrument for a particular roughness calculation. From these results, a root mean square (RMS) surface roughness was obtained from image statistics for several length scales. These data are shown in Table 2A. Note that curvature in the sample may influence the measured surface roughness particularly on longer length scales and care was taken to avoid this.

Figure 3A:
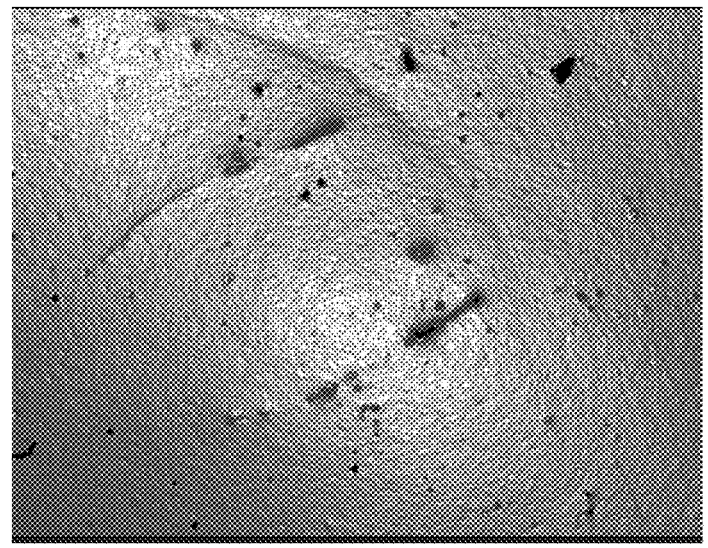
FIGS. 3a, 3b, 3c, and 3d are optical micrographs, measured on a 2.9 mm length scale, of an exterior surface for supporting the photosensitive element during thermal development.
Figure 3B:
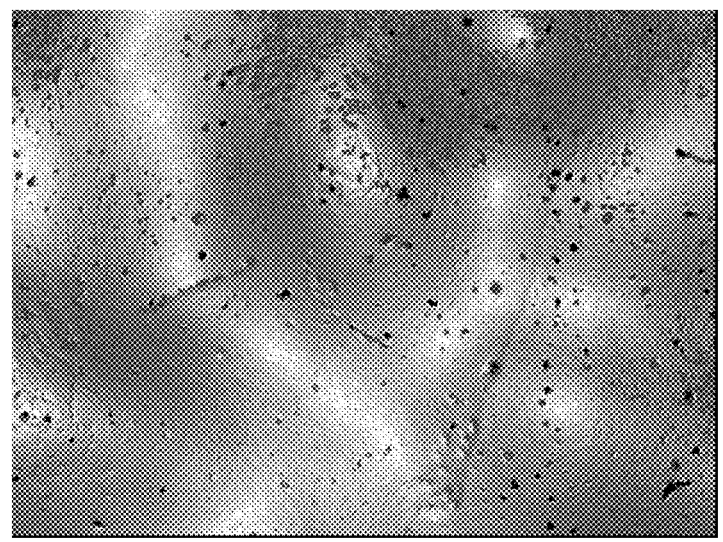
Figure 3C:
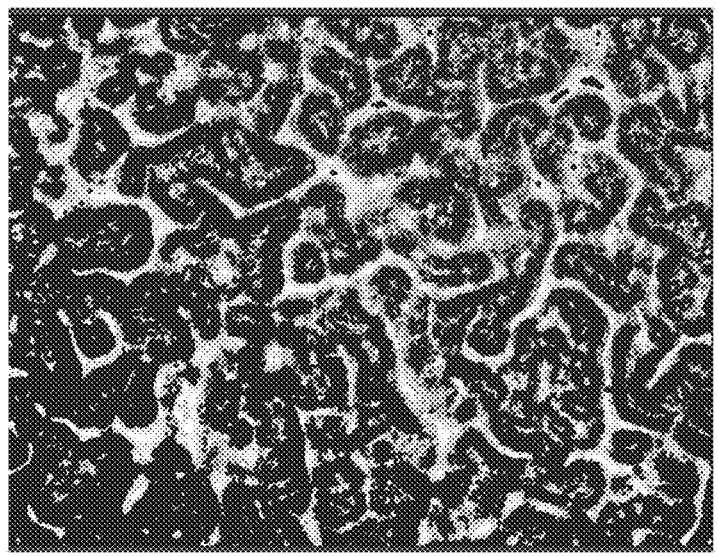
Figure 3D:
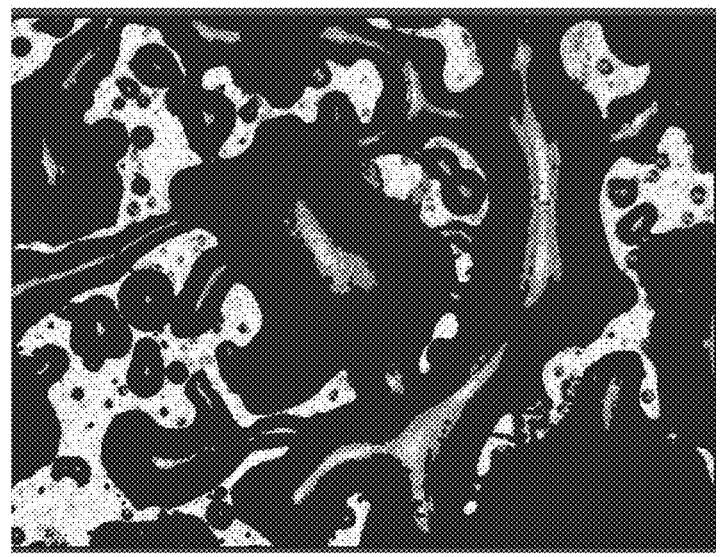

FIGS. 3a, 3b, 3c, and 3d are optical micrographs of the surfaces that were characterized. FIG. 3a shows the surface of a representative control, and FIG. 3b represents the roughest surface generated by the prior art process (both without intentional texturing). FIG. 3c shows the surface defined as Texture 2. FIG. 3d shows the surface defined as Texture 3. The optical micrographs were provided by the Zygo instrument described above.

Figure 4A:
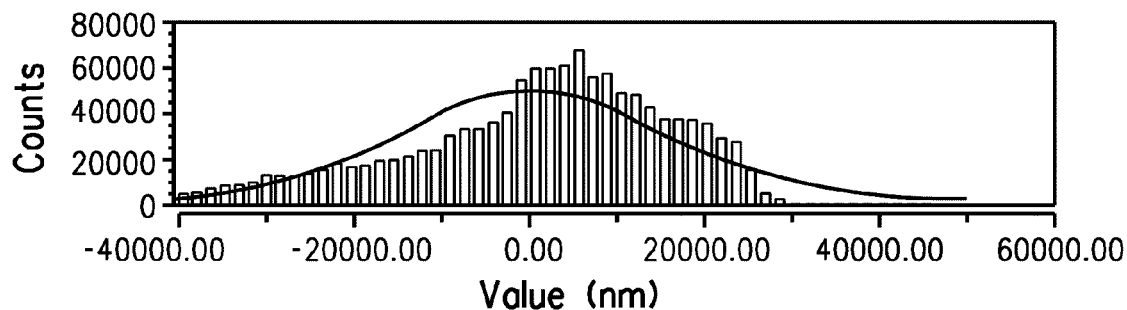
FIGS. 4a, 4b, and 4c are histogram plots of counts of occurrences on the y (vertical) axis versus the magnitude of deviations from the average surface height labeled as Value (and expressed in nanometers) on the x (horizontal) axis, for three different exterior surfaces of a supporting base member.
Figure 4B:
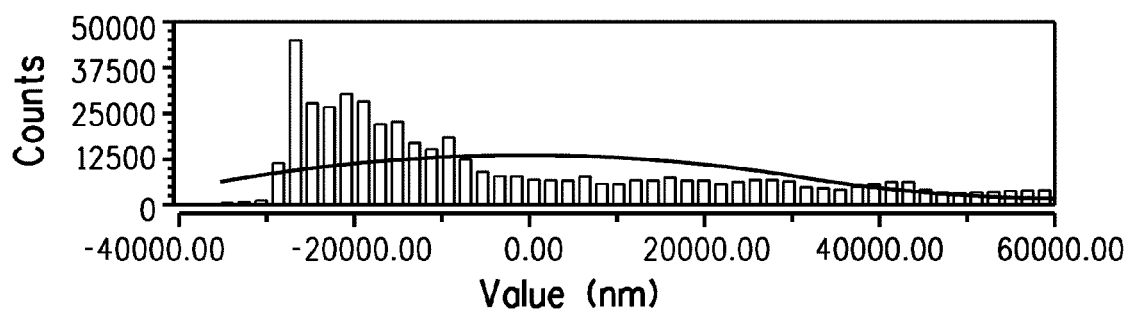
Figure 4C:
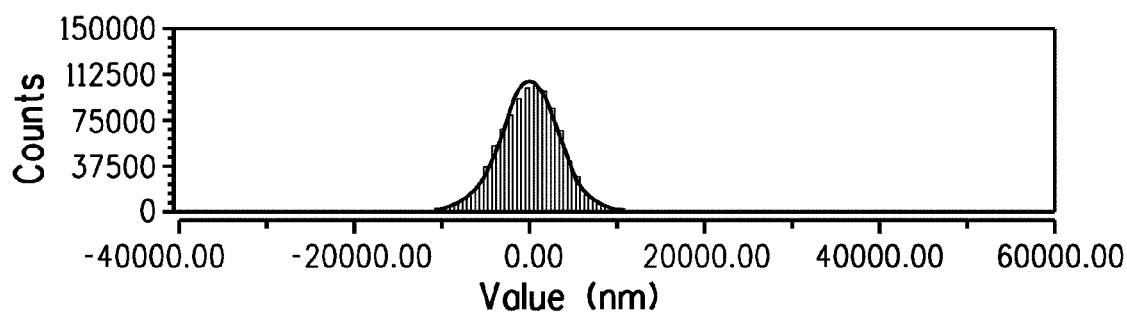

Another result from the Zygo instrument was a histogram of the deviations from the average surface height, which are shown in FIGS. 4a, 4b, and 4c. Skew in these distributions was apparent as a lack of symmetry in the histogram plots. For the Control sample (the rougher of the non-textured samples), the histogram of FIG. 4a shows the distribution was negatively skewed indicating that the larger magnitude deviations in surface height were depressions (i.e., pits) below the average surface level. Conversely, the histogram of FIG. 4b for Texture 3 showed a positively skewed distribution with the positive tail indicating that the larger magnitude deviations were peaks above the average surface height. The distribution for Texture 2 was a rather symmetric distribution as shown in the histogram of FIG. 4c. All of these histograms were for measurements made over a 1 cm length scale. The skew statistics for these distributions are shown in Table 2A. Table 2A also shows the number, height, and size of peaks from the surface topography analysis using a 20 μm reference band (10 μm above and below the average) and a minimum peak size of 5000 μm² over a 75 mm² area. The percent coverage is the ratio of the total peak area to the total measured area.

The exterior surfaces were also measured for surface tack on a Lab Master Tack Tester from Testing Machines Incorporated in Islandia, N.Y. Samples were tested with a 500 g dwell load, loading time of 4 sec, dwell time of 1 sec, with a plunger having an area of contact that was 0.9 cm in diameter (0.64 cm² in area), and tensile speed of 600 mm/min. Reported is the maximum force in grams.

Example 1 with the exceptions that the hot roll temperature was 335° F. and the pressure was reduced by 10% for all cycles. The conditions for each cycle were varied as dictated by the established operating method for the thermal processor. The plates were processed and evaluated by the same individual for wave severity, wave extent, and creases. Plate evaluations are reported in Table 2B.

TABLE 2B

|  | Plate Evaluation for | Control | Texture 2 | Texture 3 |
|---|---|---|---|---|
| T2 Target | Wave Severity | 2 | 2 | 0.5 |
|  | Extent (% coverage) | 30% | 25% | 5% |
|  | Creases | Yes | No | No |
| T1 Target | Wave Severity | 4 | 4 | 2 |
|  | Extent | 75% | 65% | 10% |

The scale for wave severity was 0 to 5, wherein a severity rating of 0 is a plate having no waves and a severity rating of 5 is a plate having an extreme amount and/or size of waves which is not acceptable. The severity rating of 0.5 indicates that the plate had waves that are difficult to see from the backside of the plate and are not functional distortions. Waves of severity 2 are clearly evident from the backside of the plate

TABLE 2A

| Surface Characterization | Length scale | Control* | Roughest Control** | Texture 2 | Texture 3 |
|---|---|---|---|---|---|
| RMS Roughness (μm) | 72 μm | 0.029 | 0.041 | 1.19 | 0.019 |
|  | 289 μm | 0.090 | 0.115 | 2.35 | 1.88 |
|  | 718 μm | 0.410 | 0.666 | 2.70 | 10.4 |
|  | 2879 μm | 2.04 | 2.93 | 3.13 | 11.9 |
|  | 10000 μm |  | 15.8 | 3.30 | 27.2 |
| Skew | — | — | −0.785 (Negative) | −0.015 (Symmetric) | 1.044 (Positive) |
| Projections |  |  | 5 | 4 | 60 |
| Pits |  |  | 6 | 0 | 130 |
| Avg. Projection Height (microns) |  |  | 22.58 | 11.97 | 33.67 |
| Projection Area (mm²) |  |  | 28.11858 | 0.04716 | 11.18306 |
| Projection Density (projections/mm²) |  |  | 0.05 | 0.055 | 1.493 |
| Average Projection area (mm²) |  |  | 5.62 | 0.0118 | 0.186 |
| % Coverage |  |  | 37% | 0.063% | 15% |
| Tack (grams) | — | 100 | — | 32 | 10 |

*Average of representative samples of the exterior surface of two drum supports used in the prior art thermal processors. The tack measurement is an average of 10 representative samples.
**Of the control samples, the one control sample having the most roughness.

All plates were thermally processed on a thermal processor having a hot roller, infrared heaters, and a drum with a removable flexible support member according to U.S. Publication No. US 2005/0142494. (which priority is from U.S. provisional patent application Ser. No. 60/533,711, filed Dec. 31, 2003). For each series of tests on the exterior surface of the flexible support member for Texture 2, Texture 3, and the Control, one of the flexible support members was mounted to the drum by wrapping the support member about an outer circumferential surface of the drum to overlap the ends of the support member, and securing the support member with fasteners within the clamp recess, as described in the previously cited U.S. provisional patent application Ser. No. 60/533,711. The development medium was CEREX® nylon nonwoven (Cerex Advanced Fabrics, from Pensacola, Fla.). As described above, the Control flexible support member had the prime and smooth coats, but no applied textured coat. The processor was operated with the conditions as described in and can be seen from the print surface side. The severity rating of 4 indicates that the plate has particularly severe waves that result in printable defects. As was explained in Example 1, severity ratings of below 2 are considered commercially acceptable. The wave extent is the fraction of the plate that is affected by waves, expressed as a percent coverage. The wave extent was determined by drawing a grid underneath the plate and counting the grid squares which contain at least one wave, and dividing the total number of squares containing wave/s by the total grid of squares and multiplying by 100. Creases are folds in the support base of the photosensitive element. The presence of creases is unacceptable for printing.

The results of the surface characterization and plate evaluations indicate that a textured surface supporting the photosensitive element during thermal processing is beneficial to reduce or eliminate defects such as waves and/or creases in the resulting printing plate.

More specifically, a support surface having texture with a surface roughness of greater than 1 micron (based on RMS roughness and on 718 micron length scale) and having a tack below 100 grams reduces or eliminates crease formation in the plate. A support surface having texture with a surface roughness greater than 3 microns (based on RMS roughness and on 718 micron length scale) and having tack below 30 grams reduces or eliminates wave severity and the extent of wave coverage on the plate.

Surfaces with a positive skew in the histograms of frequency versus height for a 1 cm length scale measurement show a greater benefit of increasing roughness than do negatively skewed distributions. The roughest control sample had higher roughness on the 1 cm (10000 μm scale) than Texture 2 but a highly negatively skewed distribution. The performance of the Control surface is not advantageous relative to Texture 2 and clearly worse than Texture 3.

Surfaces with a density of at least 0.1 projections/mm$^2$ that are at least 10 μm above the average surface with average projection areas on the order of 0.05-1 mm$^2$, to 3 mm$^2$, and perhaps to as much as 5 mm$^2$, give improved performance in the thermal processor. A small number of large projections as shown in the roughest control sample was not effective in eliminating waves or creases in the resulting printing plate.

Example 3

The following example demonstrates the method of the present invention using a base member that is a planar support. The planar support includes an elastomeric layer having a pattern by overlaying a grid of fine linear equidistant grooves with a regular pattern of fine pits.

A thermal development processor having a hot roller, infrared heaters, and a planar support with a removable flexible support member according to U.S. Publication No. US 2005/0142494. (which priority is from U.S. provisional patent application Ser. No. 60/533,711, filed Dec. 31, 2003) was used to thermally process a photosensitive element. The thermal development processor was shown in FIG. 3 and described as the second embodiment. Throughout this example, this embodiment of the thermal processor will be referred to as a tabletop thermal processor.

The photosensitive element that was thermally developed was a CYREL® type DFH (45 mil) flexographic printing element. The element was exposed as described in Example 1 and thermally developed as follows.

The base member in the tabletop thermal processor was a planar support such as a horizontal tabletop. Mounted onto the planar support was a flexible support member that included a layer of a modification material that had an exterior surface with texture according to the present invention. The flexible support member was formed from a photosensitive elastomeric element having a photopolymerizable elastomeric composition layer, i.e., the modification material layer. The support member was prepared from a photosensitive printing plate having a layer of a photosensitive elastomeric composition comprised of an elastomeric binder, monomer, photoinitiator and additives. A CYREL® flexographic printing plate, type DPS (45 mil) with the coversheet removed, was imagewise exposed through an overlay composed of a laser mask having a grid of negative lines (line width 200 micron) that were 5 mm apart (line to line distance) overlaid by a 85% dot screen, to radiation at 365 nm for 8 minutes (corresponding to an energy of 11 J/cm$^2$). The plate was back exposed, through a base side of the plate, to radiation at 365 nm for 35 seconds (corresponding to an energy of 800 mJ/cm$^2$). The exposed element was then processed in Flexo-Sol solvent in a CYREL® Smart XL processor, for 7 minutes, and dried in an oven. The dried plate element was neither postexposed nor finished in order to keep natural tackiness of the exposed photopolymer. The exterior surface, i.e., imaged surface, of the dried element was measured for surface tack on the instrument described in Example 2. The tack of the exterior surface was about 600 grams. This plate became the support member with a layer of resilient material having an exterior textured surface of the above described pattern, e.g. 85% screen dots.

The so prepared support member was mounted on top of a 2.1 mm CyComp foam fixed to the tabletop base, thereby tensioning the support member to the base member. The exposed DFH printing element was placed on the support member so that the base side of the printing element was adjacent and in contact with the exterior patterned texture surface of the support member. The printing element was held in place on the support member with one or more clamps located on the tabletop and positioned at one edge of the element.

The tabletop thermal processor included a sledge assembly that traverses the tabletop and carries the absorbent material across the exterior surface of the plate during thermal development. Mounted in the sledge assembly were a rotatably mounted hot roller, radiant infrared heaters, and one or more web guide rolls. Relative motion between the hot roller and the platen was by moving swing arms that were actuated by air cylinders to move the hot roller toward the printing element. A continuous web of the absorbent material as described in Example 2 was mounted on the sledge assembly. A separate rubber roller is mounted in front of the sledge which is used just in the first cycle in order to press the plate to the support surface for intimate contact and removal of air between these two surfaces assisted by the support surface pattern (grooves).

The processor was operated with the sledge assembly starting at one end of the tabletop. The printing element was preheated with the radiant heaters. The hot roller was also preheated. The hot roller was moved toward the element by the actuating the air cylinders to carry the web of the absorbent material into contact with the exterior surface of the element. Intimate contact of the absorbent web to the element was maintained by pressing the element and the absorbent web together. The sledge assembly traversed the planar support rotating the hot roller from the starting edge to a trailing edge of the element. The thermal processor was operated with the following development conditions: hot roll surface temperature of 163° C., a pressure corresponding to a load of about 11 N/mm, and a sledge transport speed of 800 mm/min. The plate composition layer was heated to 105° C. while in contact with the absorbent material. The absorbent material contacted the exterior surface of the composition layer of the heated plate, and absorbed the liquefied portions of the polymer from the unirradiated portions of the composition layer, forming a relief pattern or surface. As the sledge assembly traversed the hot roller, the absorbent web was separated from the printing element while the element was still in the heated condition. After the sledge assembly completed the pass across the element to its trailing edge, the hot roller was retracted and the sledge returned to the start position for the next cycle. The cycle of the steps of heating the element and contacting the softened photopolymer with an absorbent material was repeated eight times to adequately remove the uncured material and create sufficient relief depth.

During the thermal development cycles, the DFH plate stayed in close contact to the tacky support surface without lifting and formation of any waves. After development the DFH plate could be removed from the support with reasonable force and showed a flat undistorted base.

A Control was done under the same conditions described above except that the DFH plate was placed directly on the surface of the CyComp foam instead of on the structured tacky elastomeric support layer. The CyComp foam layer had a smooth and non-tacky surface. Upon thermal processing as described above, the DFH plate exhibited severe deformation.

What is claimed is:

1. A method for forming a relief structure from a photosensitive element having an exterior surface and an interior surface and containing a composition layer capable of being partially liquefied comprising:
    supplying a development medium to the exterior surface with a first member;
    supporting the photosensitive element on a base member having an exterior surface, wherein the interior surface of the element is adjacent the exterior surface of the base member; and
    wherein the exterior surface of the base member defines a plane that is characterized by a plurality of surface projections from the plane, the exterior surface having a tack between 10 and 40 grams and a texture having a roughness, Rq, of at least 1 micron when measured over a 250 to 1000 micron length scale,
    wherein the combination of surface projections, tack and texture reduces air entrapment between the element and the base member, and allows for movement or slippage of the photosensitive element on the base member during relief structure formation, and
    wherein the method further comprises applying a layer of a modification material to the base member wherein the layer of material forms the exterior surface having texture, wherein the applying of the layer is with a texturing spray gun that both applies the layer and also renders the texture to the layer.

2. The method of claim 1 wherein the layer is resilient or tacky.

3. The method of claim 1 wherein the modification material is selected from the group consisting of natural rubbers, synthetic rubbers, and elastomers.

4. The method of claim 1 wherein the layer further comprises a roughening component.

5. The method of claim 1 wherein the base member is a selected from the group consisting of a drum, a roller, a platform member, a flexible support member, and a planar support.

6. The method of claim 1 further comprising placing a flexible support member between the base member and the element, wherein the flexible support member has a surface which is the exterior surface having texture.

7. The method of claim 6 further comprising applying a layer of a modification material to the flexible support member wherein the layer of material forms the exterior surface having texture.

8. The method of claim 6 further comprising adding at least one layer to the flexible support member selected from the group consisting of a resilient layer, a tacky layer, a protective layer, a resilient and tacky layer, and combinations thereof.

9. The method of claim 6 wherein the flexible support member comprises an aluminum sheet having a layer of silicone rubber on one side and a tacky layer on the silicone rubber layer, and wherein at least the tacky layer has texture.

10. The method of claim 1 wherein the surface roughness, Rq, is at least 1 micron when measured over a 250 to 750 micron length scale.

11. The method of claim 1 wherein the surface roughness, Rq, is at least 5 micron when measured over a 700 to 750 micron length scale.

12. The method of claim 1 further comprising applying a layer of an elastomeric material to the base member that forms the exterior surface of the base member and has the texture.

13. The method of claim 1 wherein the exterior surface defines a plane containing a plurality of projections and a plurality of pits that have a height relative to the plane, wherein an average height of the projections and pits is positive.

14. The method of claim 1 wherein the exterior surface defines a plane containing a plurality of projections and a plurality of pits, each having a height relative to the plane and a deviation from an average surface height, wherein at least 60% of a range of the deviations from the average height are projections above the average surface height.

15. The method of claim 1 wherein the exterior surface defines a plane containing a plurality of projections such that at least 60% of the surface is covered with projections.

16. The method of claim 1 further comprising heating the exterior surface of the element to a temperature sufficient to cause a portion of the layer to liquefy.

17. The method of claim further comprising contacting the exterior surface of the photosensitive element with a development medium to allow at least a portion of the liquefied material of the composition layer to be absorbed by the development medium.

18. The method of claim 17 further comprising separating the photosensitive element from the development medium.

19. The method of claim 17 wherein the contacting comprises pressing the photosensitive element and the development medium into contact at a pressure sufficient for at least a portion of the liquefied material of the composition layer to be absorbed by the development medium.

20. The method of claim 1 further comprising heating the exterior surface of the element to a temperature sufficient to cause a portion of the layer to liquefy, wherein the heating is selected from the group consisting of
    a first heating which applies heat to an exterior surface of the composition layer adjacent where a development medium contacts the layer, the first heating adapted to heat the exterior surface of the layer;
    a second heating to heat the first member to a temperature capable of heating the exterior surface of the composition layer while the development medium is contacting the exterior surface of the layer;
    a third heating to heat the base member to a temperature capable of heating the exterior surface of the composition layer;
    combination of the first heating and the second heating;
    combination of the first heating and the third heating;
    combination of the second heating and the third heating; and
    combination of the first heating, the second heating, and the third heating,
    wherein the first heating, the second heating, and the third heating, individually or in the above combinations, is capable of heating the exterior surface of the composition layer sufficiently to cause a portion of the layer to liquefy.

21. The method of claim 1 wherein the exterior surface defines a plane that is characterized by a plurality of surface projections from the plane wherein the exterior surface has a density of projections of at least 0.1 projections/mm$^2$ that are at least 10 microns in height above the plane.

22. The method of claim 21 wherein the projections have an average area of less than 5 mm².

23. The method of claim 21 wherein the projections have an average area of 0.05-1 mm².

24. The method of claim 1 wherein the exterior surface defines a plane containing a plurality of projections such that 15% of the surface or less is covered with projections.

25. The method of claim 1 wherein the texture is formed by an irregular pattern of a plurality of projections and a plurality of pits.

26. A method for forming a relief structure from a photosensitive element having an exterior surface and an interior surface and containing a composition layer capable of being partially liquefied comprising:
supplying a development medium to the exterior surface with a first member;
supporting the photosensitive element on a base member having an exterior surface, wherein the interior surface of the element is adjacent the exterior surface of the base member; and
wherein the exterior surface of the base member defines a plane that is characterized by a plurality of surface projections from the plane, the exterior surface having a tack between 10 and 40 grams and a texture with a surface roughness, Rq, of at least 3 micron when measured over a 500 to 3000 micron length scale,
wherein the combination of surface projections, tack and texture reduces air entrapment between the element and the base member, and allows for movement or slippage of the photosensitive element on the base member during relief structure formation, and
wherein the method further comprises applying a layer of a modification material to the base member wherein the layer of material forms the exterior surface having texture, wherein the applying of the layer is with a texturing spray gun that both applies the layer and also renders the texture to the layer.

27. The method of claim 26 wherein the surface roughness, Rq, is at least 5 micron when measured over a 700 to 3000 micron length scale.

28. The method of claim 26 wherein the surface roughness, Rq, is 3 to 25 micron when measured over a 700 to 3000 micron length scale.

29. The method of claim 26 wherein the surface roughness, Rq, is 5 to 15 micron when measured over a 700 to 3000 micron length scale.

30. An apparatus for forming a relief structure from a photosensitive element having an exterior surface and an interior surface and containing a composition layer capable of being partially liquefied comprising:
means for supplying a development medium to the exterior surface with a first member;
a base member for supporting the photosensitive element, wherein the interior surface of the element is adjacent an exterior surface of the base member; and
wherein the exterior surface of the base member defines a plane that is characterized by a plurality of surface projections from the plane, the exterior surface having a tack between 10 and 40 grams and a texture having a roughness, Rq, of at least 1 micron when measured over a 250 to 1000 micron length scale;
wherein the combination of surface projections, tack and texture reduces air entrapment between the element and the base member, and allows for movement or slippage of the photosensitive element on the base member during relief structure formation; and
wherein the base member is coated with a layer of a modification material that forms the exterior surface having texture, wherein the layer of modification is applied to the base member with a texturing spray gun that both applies the layer and also renders the texture to the layer.

31. The apparatus of claim 30 wherein the layer is resilient or tacky.

32. The apparatus of claim 30 wherein the modification material is selected from the group consisting of natural rubbers, synthetic rubbers, and elastomers.

33. The apparatus of claim 30 wherein the base member is a selected from the group consisting of a drum, a roller, a platform member, a flexible support member, and a planar support.

34. The apparatus of claim 30 further comprising a flexible support member between the base member and the element, wherein the flexible support member has a surface which is the exterior surface having texture.

35. The apparatus of claim 34 further comprising a layer of a modification material on the flexible support member on a side opposite the base member, wherein the layer of material forms the exterior surface having texture.

36. The apparatus of claim 35 wherein the layer is selected from the group consisting of a resilient layer, a tacky layer, a protective layer, a resilient and tacky layer, and combinations thereof.

37. The apparatus of claim 34 wherein the flexible support member comprises an aluminum sheet having a layer of silicone rubber on one side and a tacky layer on the silicone rubber layer, and wherein at least the tacky layer has texture.

38. The apparatus of claim 30 wherein the surface roughness, Rq, is at least 1 micron when measured over a 250 to 750 micron length scale.

39. The apparatus of claim 30 wherein the surface roughness, Rq, is at least 5 micron when measured over a 700 to 750 micron length scale.

40. The apparatus of claim 30 wherein the exterior surface defines a plane containing a plurality of projections and a plurality of pits that each have a height relative to the plane which determine an average height, wherein the average height of the projections and pits is positive.

41. The apparatus of claim 30 wherein the exterior surface defines a plane containing a plurality of projections and a plurality of pits, each having a height relative to the plane and a deviation from an average surface height, wherein at least 60% of a range of the deviations from the average height are projections above the average surface height.

42. The apparatus of claim 30 further comprising means for heating the exterior surface of the element to a temperature sufficient to cause a portion of the layer to liquefy.

43. The apparatus of claim 30 further comprising means for contacting the exterior surface of the photosensitive element with a development medium to allow at least a portion of the liquefied material of the composition layer to be absorbed by the development medium.

44. The apparatus of claim 30 further comprising means for separating the photosensitive element from the development medium.

45. The apparatus of claim 30 further comprising means for pressing the photosensitive element and the development medium into contact at a pressure sufficient for at least a portion of the liquefied material of the composition layer to be absorbed by the development medium.

* * * * *